(12) United States Patent
Park et al.

(10) Patent No.: US 11,218,174 B2
(45) Date of Patent: Jan. 4, 2022

(54) METHOD AND SYSTEM FOR STORING DATA LOCALLY REPAIRABLE AND EFFICIENT MULTIPLE ENCODING

(71) Applicants: NAVER Corporation, Seongnam-si (KR); INDUSTRY-UNIVERSITY COOPERATION FOUNDATION HANYANG UNIVERSITY ERICA CAMPUS, Ansan-si (KR)

(72) Inventors: Chanyoung Park, Ansan-si (KR); Jiwoong Won, Ansan-si (KR); Junhee Ryu, Ansan-si (KR); Kyungtae Kang, Ansan-si (KR); Yun-cheol Choo, Seongnam-si (KR); Sung-Won Jun, Seongnam-si (KR); Taewoong Kim, Seongnam-si (KR)

(73) Assignees: Naver Corporation, Gyeonggi-do (KR); Industry-University Cooperation Foundation Hanyang University Erica Campus, Gyeonggi-do (KR)

(*) Notice: Subject to any disclaimer, the term of this patent is extended or adjusted under 35 U.S.C. 154(b) by 76 days.

(21) Appl. No.: 16/655,812

(22) Filed: Oct. 17, 2019

(65) Prior Publication Data
US 2020/0127684 A1 Apr. 23, 2020

(30) Foreign Application Priority Data
Oct. 23, 2018 (KR) .................. 10-2018-0127033

(51) Int. Cl.
*H03M 13/29* (2006.01)
*G06F 17/16* (2006.01)
*H03M 13/37* (2006.01)

(52) U.S. Cl.
CPC .......... *H03M 13/293* (2013.01); *G06F 17/16* (2013.01); *H03M 13/2942* (2013.01); *H03M 13/373* (2013.01)

(58) Field of Classification Search
CPC ........... H03M 13/293; H03M 13/2942; H03M 13/373; H03M 13/098; H03M 13/2906; G06F 17/16
(Continued)

(56) References Cited

U.S. PATENT DOCUMENTS 9,870,284 B2 * 1/2018 Blaum ............... H03M 13/2945
2010/0306627 A1 * 12/2010 Sakai ................. H03M 13/1102
714/781
(Continued)

FOREIGN PATENT DOCUMENTS

KR 101533340 B1 7/2015

*Primary Examiner* — James C Kerveros
(74) *Attorney, Agent, or Firm* — Harness, Dickey & Pierce, P.L.C.

(57) ABSTRACT

Provided are methods and systems for storing data using locally repairable multiple encoding. A data storage method may include generating n N×M encoding matrices, each including an M×M first matrix, an 1×M second matrix in which all of elements have a value of 1, and an M×M third matrix that is a symmetric matrix in which respective columns are configured by changing a sequence of elements from an element set; arranging the encoding matrices into a plurality of groups; generating a data block through the first matrix, a local parity block through the second matrix, and a global parity block through the third matrix by encoding source data of a first group with a first encoding matrix among the encoding matrices arranged into the first group; and merging the global parity block with a global parity block of a second encoding matrix that is different than the first encoding matrix.

18 Claims, 16 Drawing Sheets

(58) Field of Classification Search
USPC .......................................................... 714/752
See application file for complete search history.

(56) References Cited

U.S. PATENT DOCUMENTS

2014/0006897 A1* 1/2014 Franceschini ......... H03M 13/15
714/755
2016/0352462 A1* 12/2016 Oh ........................ H04L 1/0057
2017/0324430 A1* 11/2017 Han .................... G06F 11/1076
2018/0293134 A1* 10/2018 Jin ..................... H03M 13/3761
2018/0314594 A1* 11/2018 Yamamoto ........ H03M 13/2906

* cited by examiner

FIG. 2

$$E = \begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 1 & 1 \\ a & b & c & d \\ b & a & d & c \\ c & d & a & b \\ d & c & b & a \end{bmatrix} \begin{matrix} \left.\vphantom{\begin{matrix}1\\0\\0\\0\end{matrix}}\right\}E_I \\ \left.\vphantom{1}\right\}E_L \\ \left.\vphantom{\begin{matrix}a\\b\\c\\d\end{matrix}}\right\}E_G \end{matrix}$$

FIG. 3

$$E_1 = \begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 1 & 1 \\ a & b & c & d \\ b & a & d & c \\ c & d & a & b \\ d & c & b & a \end{bmatrix} \quad E_2 = \begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 1 & 1 \\ e & f & g & h \\ f & e & h & g \\ g & h & e & f \\ h & g & f & e \end{bmatrix}$$

Merge $$E' = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 1 & 1 & 1 & 1 & 1 & 1 & 1 \\ a & b & c & d & e & f & g & h \\ b & a & d & c & f & e & h & g \\ c & d & a & b & g & h & e & f \\ d & c & b & a & h & g & f & e \end{bmatrix}$$

FIG. 6

$$E_i = \begin{bmatrix} 1 & 0 \\ 0 & 1 \\ 1 & 1 \\ a & b \\ b & a \end{bmatrix} \quad E_j = \begin{bmatrix} 1 & 0 \\ 0 & 1 \\ 1 & 1 \\ a & b \\ b & a \end{bmatrix} \quad E_{i+j} = \begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 0 & 0 \\ 0 & 0 & 1 & 1 \\ a & b & c & d \\ b & a & d & c \end{bmatrix}$$

Data block
Local parity block
Global parity block $$E = \begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 0 & 0 \\ 0 & 0 & 1 & 1 \\ a & b & c & d \\ b & a & d & c \end{bmatrix}$$

Data block
Local parity block
Global parity block $X_1 + X_2 = S_1$
$X_3 + X_4 = S_2$
$c_1 S_1 + c_2 S_2 = P_1 + P_2$
※ $c_1 = a + b, c_2 = c + d$ $$E = \begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 0 & 0 \\ 0 & 0 & 1 & 1 \\ a & b & c & d \\ b & a & d & c \end{bmatrix}$$

※ $P_3 = S_1 + S_2$

Data block
Local parity block
Global parity block (6, 4) Erasure code    (7, 4) Erasure code $$\begin{bmatrix} 1 & 0 & 0 & 0 \\ 0 & 1 & 0 & 0 \\ 0 & 0 & 1 & 0 \\ 0 & 0 & 0 & 1 \\ a & b & c & d \\ b & a & d & c \end{bmatrix} \quad \begin{bmatrix} 1 & 0 & 0 & 0 \\ 0 & 1 & 0 & 0 \\ 0 & 0 & 1 & 0 \\ 0 & 0 & 0 & 1 \\ 1 & 1 & 1 & 1 \\ a & b & c & d \\ b & a & d & c \end{bmatrix}$$

FIG. 11

$$\begin{bmatrix}
1 & 0 & 0 & 0 & 0 & 0 & 0 & 0 & 0 & 0 & 0 & 0 \\
0 & 1 & 0 & 0 & 0 & 0 & 0 & 0 & 0 & 0 & 0 & 0 \\
0 & 0 & 1 & 0 & 0 & 0 & 0 & 0 & 0 & 0 & 0 & 0 \\
0 & 0 & 0 & 1 & 0 & 0 & 0 & 0 & 0 & 0 & 0 & 0 \\
0 & 0 & 0 & 0 & 1 & 0 & 0 & 0 & 0 & 0 & 0 & 0 \\
0 & 0 & 0 & 0 & 0 & 1 & 0 & 0 & 0 & 0 & 0 & 0 \\
0 & 0 & 0 & 0 & 0 & 0 & 1 & 0 & 0 & 0 & 0 & 0 \\
0 & 0 & 0 & 0 & 0 & 0 & 0 & 1 & 0 & 0 & 0 & 0 \\
0 & 0 & 0 & 0 & 0 & 0 & 0 & 0 & 1 & 0 & 0 & 0 \\
0 & 0 & 0 & 0 & 0 & 0 & 0 & 0 & 0 & 1 & 0 & 0 \\
0 & 0 & 0 & 0 & 0 & 0 & 0 & 0 & 0 & 0 & 1 & 0 \\
0 & 0 & 0 & 0 & 0 & 0 & 0 & 0 & 0 & 0 & 0 & 1 \\
1 & 1 & 1 & 1 & 0 & 0 & 0 & 0 & 0 & 0 & 0 & 0 \\
0 & 0 & 0 & 0 & 1 & 1 & 1 & 1 & 0 & 0 & 0 & 0 \\
0 & 0 & 0 & 0 & 0 & 0 & 0 & 0 & 1 & 1 & 1 & 1 \\
149 & 154 & 174 & 182 & 52 & 194 & 70 & 5 & 133 & 125 & 168 & 58 \\
154 & 149 & 182 & 174 & 194 & 52 & 5 & 70 & 125 & 133 & 58 & 168 \\
174 & 182 & 149 & 154 & 70 & 5 & 52 & 194 & 168 & 58 & 133 & 125 \\
182 & 174 & 154 & 149 & 5 & 70 & 194 & 52 & 58 & 168 & 125 & 133
\end{bmatrix}$$

FIG. 13

$$\begin{bmatrix}
1 & 0 & 0 & 0 & 0 & 0 & 0 & 0 & 0 & 0 & 0 & 0 \\
0 & 1 & 0 & 0 & 0 & 0 & 0 & 0 & 0 & 0 & 0 & 0 \\
0 & 0 & 1 & 0 & 0 & 0 & 0 & 0 & 0 & 0 & 0 & 0 \\
0 & 0 & 0 & 1 & 0 & 0 & 0 & 0 & 0 & 0 & 0 & 0 \\
0 & 0 & 0 & 0 & 1 & 0 & 0 & 0 & 0 & 0 & 0 & 0 \\
0 & 0 & 0 & 0 & 0 & 1 & 0 & 0 & 0 & 0 & 0 & 0 \\
0 & 0 & 0 & 0 & 0 & 0 & 1 & 0 & 0 & 0 & 0 & 0 \\
0 & 0 & 0 & 0 & 0 & 0 & 0 & 1 & 0 & 0 & 0 & 0 \\
0 & 0 & 0 & 0 & 0 & 0 & 0 & 0 & 1 & 0 & 0 & 0 \\
0 & 0 & 0 & 0 & 0 & 0 & 0 & 0 & 0 & 1 & 0 & 0 \\
0 & 0 & 0 & 0 & 0 & 0 & 0 & 0 & 0 & 0 & 1 & 0 \\
0 & 0 & 0 & 0 & 0 & 0 & 0 & 0 & 0 & 0 & 0 & 1 \\
1 & 1 & 1 & 1 & 1 & 1 & 1 & 1 & 1 & 1 & 1 & 1 \\
149 & 154 & 174 & 182 & 52 & 194 & 70 & 5 & 133 & 125 & 168 & 58 \\
154 & 149 & 182 & 174 & 194 & 52 & 5 & 70 & 125 & 133 & 58 & 168 \\
174 & 182 & 149 & 154 & 70 & 5 & 52 & 194 & 168 & 58 & 133 & 125 \\
182 & 174 & 154 & 149 & 5 & 70 & 194 & 52 & 58 & 168 & 125 & 133
\end{bmatrix}$$

METHOD AND SYSTEM FOR STORING DATA LOCALLY REPAIRABLE AND EFFICIENT MULTIPLE ENCODING

CROSS-REFERENCE TO RELATED APPLICATION(S)

This U.S. non-provisional application claims the benefit of priority under 35 U.S.C. § 119 to Korean Patent Application No. 10-2018-0127033 filed on Oct. 23, 2018 in the Korean Patent Office (KIPO), the entire contents of each of which are incorporated herein by reference.

BACKGROUND

Field

One or more example embodiments relate to data storage methods that promote locally repairable data and/or efficient multiple encoding, computer apparatuses configured to perform such data storage methods, and non-transitory computer-readable storage media storing one or more computer programs to perform data storage according to some example embodiments in the computer apparatus in conjunction with the computer apparatus.

Description of Related Art

Various distributed storage systems may support storing data using an erasure coding scheme.

An erasure coding scheme may promote the stability of data by generating a parity block for data, for example, by using a Reed-Solomon code. Distributively storing a total of n blocks by dividing a file into k data blocks and by generating (n−k) parity blocks is referred to as (n, k) erasure coding. The source data may be recoverable even if (n−k) blocks are erased.

Once data is stored using the erasure coding scheme as above, storage overhead may be reduced and/or relatively high availability may be secured compared to methods involving creating a replica. However, such erasure encoding schemes involve significant computing overhead occurring in encoding/decoding data and input/output (I/O) overhead that involves receiving k pieces of data for decoding at all times. For example, redundantly backing up data among a plurality of Internet data centers (IDCs) may enable recovery in the event of a malfunction of a subset of the IDCs. However, backing up a replica, for example, a complete copy of the data, may significantly increase the storage overhead. As an alternative, redundant encoding using an erasure coding scheme may cause an increase in a computational amount and/or an increase in the complexity of an assignment and encoding method. Further, erasure encoding schemes that involve many local repair codes may significantly increase the complexity in generating an encoding matrix based on (n, k) parameters, and/or performing a local repair may be difficult, and in some cases impossible, using only an exclusive OR (XOR) operation.

SUMMARY

Some example embodiments include data storage methods, computer apparatuses configured to perform the data storage, and/or non-transitory computer-readable storage media storing one or more computer program to perform the data storage method according to example embodiments in the computer apparatus in conjunction with the computer apparatus.

According to an aspect of at least one example embodiment, there is provided a data storage method performed by a computer apparatus including processing circuitry, the method including generating, by the processing circuitry, n N×M encoding matrices including an M×M first matrix, an 1×M second matrix in which all of elements have a value of 1, and an M×M third matrix that is a symmetric matrix in which respective columns are configured by changing a sequence of elements of an element set, where each of M, N, and n is a positive integer; arranging, by the processing circuitry, the encoding matrices into a plurality of groups; generating, by the processing circuitry, a data block through the first matrix, a local parity block through the second matrix, and a global parity block through the third matrix by encoding source data of a first group with a first encoding matrix among the encoding matrices arranged into the first group; and merging, by the processing circuitry, the global parity block with a global parity block of a second encoding matrix that is that is different than the first encoding matrix.

According to an aspect of at least one example embodiment, there is provided a non-transitory computer-readable storage medium storing a computer program that, when executed by processing circuitry, causes the processing circuitry to perform the data storage method.

According to an aspect of at least one example embodiment, there is provided a computer apparatus including processing circuitry configured to execute computer-readable instructions in the computer apparatus, wherein the processing circuitry is configured to generate n N×M encoding matrices including an M×M first matrix, an 1×M second matrix in which all of elements have a value of 1, and an M×M third matrix that is a symmetric matrix in which respective columns are configured by changing a sequence of elements in an element set, where each of M, N, and n is a positive integer, arrange the encoding matrices into a plurality of groups, generate a data block through the first matrix, a local parity block through the second matrix, and a global parity block through the third matrix by encoding source data of a first group with a first encoding matrix among the encoding matrices arranged into the first group, and merge the global parity block with a global parity block of a second encoding matrix that is different than the first encoding matrix.

According to some example embodiments, a locally repairable code for generating a local parity block may be generated without an additional increase in the complexity using an encoding matrix of an erasure code to prevent the complexity for generating the locally repairable code from significantly increasing to be proportional to (n, k) parameters.

Also, according to some example embodiments, a process of a finite field operation may be eliminated by recovering an erased block using an exclusive OR (XOR) operation alone, which differs from the related art in which data is recovered by applying the XOR operation to a result of the finite field operation when a local repair is required due to erasure of data and a local parity block.

Also, according to some example embodiments, in the case of redundantly encoding the same data, an intermediate result value of an existing operation may be reused instead of performing an operation on source data, which may lead to efficient multiple encoding using an XOR operation alone and accordingly, reducing a number of finite field operations.

Also, according to some example embodiments, if a plurality of pieces of data are generated from different encoding matrices, efficient multiple encoding may be performed by immediately merging any intermediate result value regardless of sequence thereof. Therefore, it is possible to enhance the implementation convenience.

Further areas of applicability will become apparent from the description provided herein. The description and specific examples in this summary are intended for illustration only and are not intended to limit the scope of the present disclosure.

BRIEF DESCRIPTION OF THE FIGURES

Example embodiments will be described in more detail with regard to the figures, wherein like reference numerals refer to like parts throughout the various figures unless otherwise specified, and wherein:

FIG. 2 illustrates an example of an encoding matrix E according to at least one example embodiment;

FIG. 3 illustrates an example of an encoding matrix E' merged from two encoding matrices $E_1$, $E_2$ according to at least one example embodiment;

FIG. 6 illustrates an example of merging encoding results from 5×2 encoding matrices $E_i$ and $E_j$ according to at least one example embodiment;

FIGS. 11 and 12 illustrate examples of an after-merge encoding matrix and a merge result according to at least one example embodiment;

FIGS. 13 and 14 illustrate examples of an available encoding matrix and merge result in response to a need for a general (n, k) erasure code decoding operation after merge according to at least one example embodiment;

Figure 1:
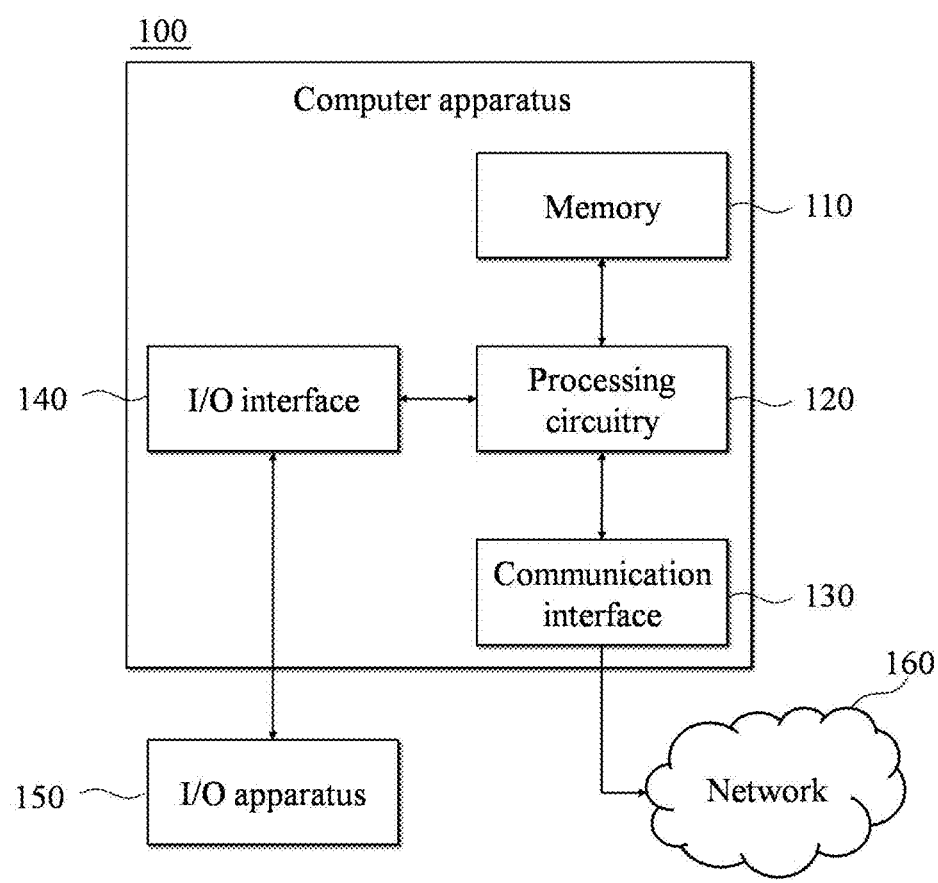
FIG. 1 illustrates an example of a computer apparatus according to at least one example embodiment.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments.

DETAILED DESCRIPTION

One or more example embodiments will be described in detail with reference to the accompanying drawings. Example embodiments, however, may be embodied in various different forms, and should not be construed as being limited to only the illustrated example embodiments. Rather, the illustrated example embodiments are provided in order to convey some concepts of this disclosure to those skilled in the art. Accordingly, known processes, elements, and techniques may not be described with respect to some example embodiments. Unless otherwise noted, like reference characters denote like elements throughout the attached drawings and written description, and such previously presented descriptions will not be repeated in the description of later drawings.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe a relationship between one element or feature to (an) other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed products. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same, similar, and/or analogous meaning as commonly understood by one of ordinary skill in the art to which some example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. For example, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware and/or a combination of hardware and software. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher-level program code that is executed using an interpreter.

For example, when a hardware device includes processing circuitry (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into processing circuitry, the processing circuitry becomes programmed to perform the program code and operations corresponding thereto, thereby transforming the processing circuitry into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. For example, software and data may be stored by one or more computer readable storage mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive, solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the processing circuitry from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, the processing circuitry of a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Hereinafter, example embodiments will be described with reference to the accompanying drawings.

The example embodiments relate to a method (hereinafter, a data storage method) of storing data to be locally repairable and to perform efficient multiple encoding, a computer apparatus for performing the data storage method, and a non-transitory computer-readable storage medium storing a computer program to perform the data storage method in the computer apparatus in conjunction with the computer apparatus. The data storage method may manage data by generating a plurality of locally repairable small-sized encoding matrices and by merging the plurality of encoding matrices. The data storage method may include a process of generating an encoding matrix, a process of placing data, and a process of encoding/decoding the data. The data storage method may improve data storage and recovery performance of a distributed storage system and may be used for data backup between a plurality of Internet data centers (IDCs).

FIG. 1 is a block diagram illustrating an example of a computer apparatus according to at least one example embodiment. A data storage system according the example embodiment may be implemented using a computer apparatus 100 of FIG. 1. A data storage method according to at least one example embodiment may be performed by the computer apparatus 100 of FIG. 1. The computer apparatus may be, for example, part of an Internet data center (IDC) that stores data in cooperation with other computer apparatuses at other Internet data centers, such that the computer apparatus or one of the other computer apparatuses may recover erased data that was stored by one of the Internet data centers. For example, the computer apparatus may establish the encoding scheme involving the collection of Internet data centers and the data stored and/or managed by each computer apparatus; may exchange, with the other computer apparatuses, global parity blocks; may merge a global parity block with other global parity blocks generated by the other computer apparatuses of the other Internet data centers; and/or may exchange a merged global parity block with the other computer apparatuses of the other Internet data centers. In this manner, the computer apparatus may recover locally stored erased data and/or may enable one of the other computer apparatuses to recover remotely stored erased data.

Referring to FIG. 1, the computer apparatus 100 may include a memory 110, processing circuitry 120, a communication interface 130, and an input/output (I/O) interface 140. The memory 110 may include a permanent mass storage device, such as random access (RAM), read only memory (ROM), and a disc drive, as non-transitory computer-readable storage medium. Here, the permanent mass storage device, such as ROM and disc drive, may be included in the computer apparatus 100 as a separate permanent storage device different from the memory 110. Also, an operating system (OS) and at least one program code may be stored in the memory 110. Such software components may be loaded from another non-transitory computer-readable storage medium to the memory 110. The other non-transitory computer-readable storage medium may include a non-transitory computer-readable storage medium, for example, a floppy drive, a disk, a tape, a DVD/CD-ROM drive, a memory card, etc. According to other example embodiments, software components may be loaded to the memory 110 through the communication interface 130, instead of, or in addition to, the non-transitory computer-readable storage medium. For example, the software components may be loaded to the memory 110 of the computer apparatus 100 based on a computer program installed by files received over a network 160.

The processing circuitry 120 may be configured to process computer-readable instructions of a computer program by performing basic arithmetic operations, logic operations, and I/O operations. The computer-readable instructions may be provided from the memory 110 or the communication interface 130 to the processing circuitry 120. For example, the processing circuitry 120 may be configured to execute received instructions in response to a program code stored in a storage device, such as the memory 110.

The communication interface 130 may provide a function for communication between the computer apparatus 100 and another apparatus, for example, the aforementioned storage devices. For example, the processing circuitry 120 of the computer apparatus 100 may transfer a request or an instruction created based on the program code stored in the storage device, such as the memory 110, to other apparatuses over the network 160 under control of the communication interface 130. Inversely, a signal, an instruction, data, a file, etc., from another apparatus may be received at the computer apparatus 100 through the communication interface 130 of the computer apparatus 100. For example, a signal, an instruction, data, etc., received through the communication interface 130 may be transferred to the processing circuitry 120 or the memory 110, and a file, etc., may be stored in a storage medium, for example, the permanent storage device, further includable in the computer apparatus 100.

The I/O interface 140 may be a device used for interface with an I/O apparatus 150. For example, an input device may include a device, such as a microphone, a keyboard, and a mouse, and an output device may include a device, such as a display device and a speaker. As another example, the I/O interface 140 may be a device for interface with an apparatus in which an input function and an output function are integrated into a single function, such as a touchscreen. The I/O apparatus 150 may be configured as a single apparatus with the computer apparatus 100.

According to other example embodiments, the computer apparatus 100 may include a number of components greater or less than a number of components shown in FIG. 1. However, there is no need to clearly illustrate many components according to the related art. For example, the computer apparatus 100 may include at least a portion of the I/O apparatus 150, or may further include other components, for example, a transceiver, a database (DB), and the like.

The communication scheme may include a near field communication method, for example, Bluetooth and near field communication (NFC), as well as a communication method using a communication network, for example, a mobile communication network, the wired Internet, the wireless Internet, and a broadcasting network, which may be included in the network 160. For example, the network 160 may include at least one of network topologies that include, for example, a personal area network (PAN), a local area network (LAN), a campus area network (CAN), a metropolitan area network (MAN), a wide area network (WAN), a broadband network (BBN), and the Internet. Also, the network 160 may include at least one of network topologies that include a bus network, a star network, a ring network, a mesh network, a star-bus network, a tree or hierarchical network, and the like. However, it is provided as an example only and the example embodiments are not limited thereto.

Hereinafter, an encoding matrix generation process, a data assignment process, and a data encoding/decoding process includable in a data storage method according to example embodiments will be described.

1. Generation of an Encoding Matrix

A method of generating an encoding matrix according to example embodiments may use a small-sized mergeable encoding matrix E as a basic unit of an operation.

FIG. 2 illustrates an example of an encoding matrix E according to at least one example embodiment. Referring to FIG. 2, the encoding matrix E may include a matrix $E_L$ for generating a data block, a matrix $E_L$ for generating a local parity block, and a matrix $E_G$ for generating a global parity block.

All of the elements included in the matrix $E_L$ have a value of 1. The matrix $E_G$ is an identity matrix, that is, a symmetric matrix in which respective columns are configured by changing a sequence of elements in an element set. The element set may be a vector having M elements, such as {a, b, c, d} for the example illustrated in FIG. 2. The respective columns of the matrix $E_G$ may consist of the elements of the element set in a different order. The matrix $E_G$ is of size M×M, wherein M is equal to k, that is, the number of data blocks into which the source data is to be divided. The matrix E is linearly independent, and remains linearly independent in a form of E' through merging with other plurality of encoding matrices. FIG. 3 illustrates an example of an encoding matrix E involving a merger of two encoding matrices $E_1$, $E_2$ according to at least one example embodiment.

A Cauchy matrix is a representative example of generating the matrix $E_G$ in the above form. Such matrices may apply to the following data assignment method and data encoding/decoding method.

2. Data Assignment

Figure 4:
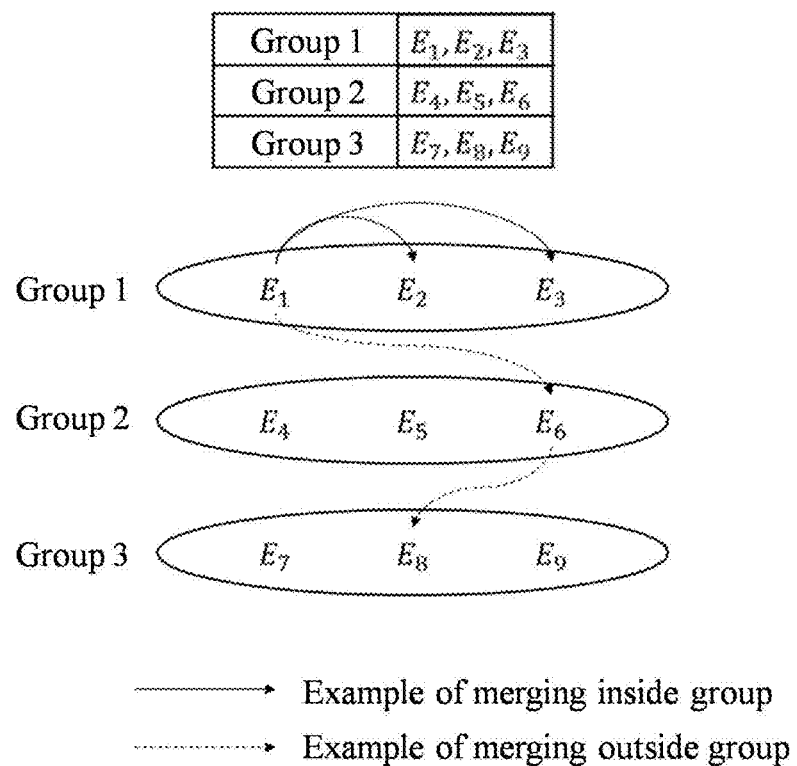
FIG. 4 illustrates an example of generating a plurality of logical groups according to at least one example embodiment.

FIG. 4 illustrates an example of generating a plurality of logical groups according to at least one example embodiment. A plurality of nonoverlapping encoding matrices may be allocated to each group among n encoding matrices $E_i$ (1<i<n) that are generated from a field K. Data may be assigned to a specific group and may be primarily encoded using an encoding matrix within the group. Data for which encoding is completed may be merged with data that is generated using another encoding matrix of the same group or of another group. According to some example embodiments, logical groups may be configured to correspond to the respective Internet data centers (IDCs). That is, n encoding matrices may be allocated to each of a plurality of IDCs.

3. Data Encoding/Decoding

Figure 5:
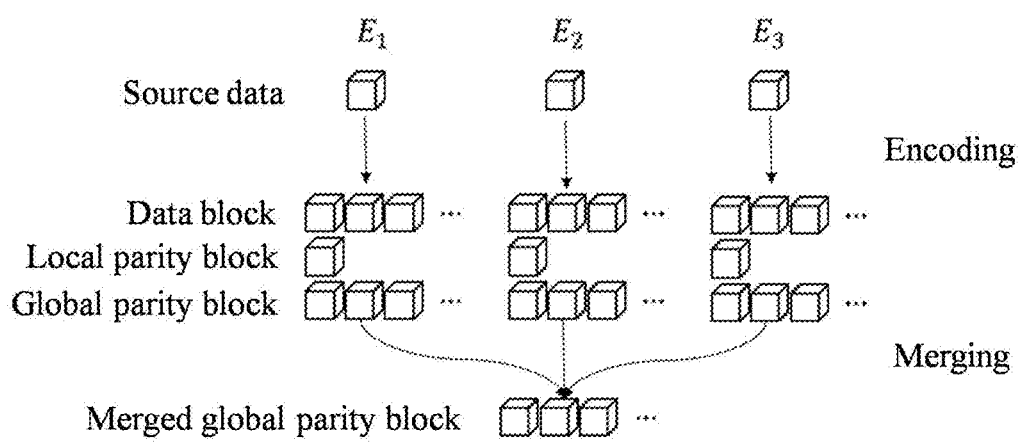
FIG. 5 illustrates an example of encoding and merging processes according to at least one example embodiment.

Data encoding may include three processes: encoding, merging, and deleting. FIG. 5 illustrates an example of encoding and merging processes according to at least one example embodiment. In FIG. 5 and each following figure with similar depictions, each block labeled "source data" represents one of the k data blocks of the source data; each block labeled "data block" represents a row of the output of the encoding of one of the k data blocks through the first encoding matrix; each block labeled "local parity block" represents a row of the output of the encoding of one of the k data blocks through the second encoding matrix; each block labeled "global parity block" represents a row of the output of the encoding of one of the k data blocks through the third encoding matrix; and each block labeled "merged global parity block" represents a merger of two or more local or global parity blocks. In the encoding process, source data that is assigned to a group may be encoded using one of the encoding matrices for the group. An erasure coding scheme encodes data using erasure code. Encoding the source data with an encoding matrix may correspond to the process of encoding the data in erasure coding, and the process for the encoding is already well known through Reed-Solomon Code, Tahoe-LAFS, Weaver Code, and the like. In the merging process, a global parity block among encoding results may be merged with a global parity block of another encoding matrix. In the deletion process, when merging is completed a certain (e.g., desired, specified, or preset) number of times, a global parity block that has been merged into the merged global parity block may be deleted.

In some example embodiments, merging may be performed by a simple exclusive OR (XOR) operation. FIG. 6 illustrates an example of merging encoding results from 5×2 encoding matrices $E_i$ and $E_j$ according to at least one example embodiment. In the case of performing additional merging between groups, for example, in the case of multiple encoding using an XOR operation, the deletion process (in which the original data is deleted) may be delayed until the additional merging between groups is completed.

Figure 7:
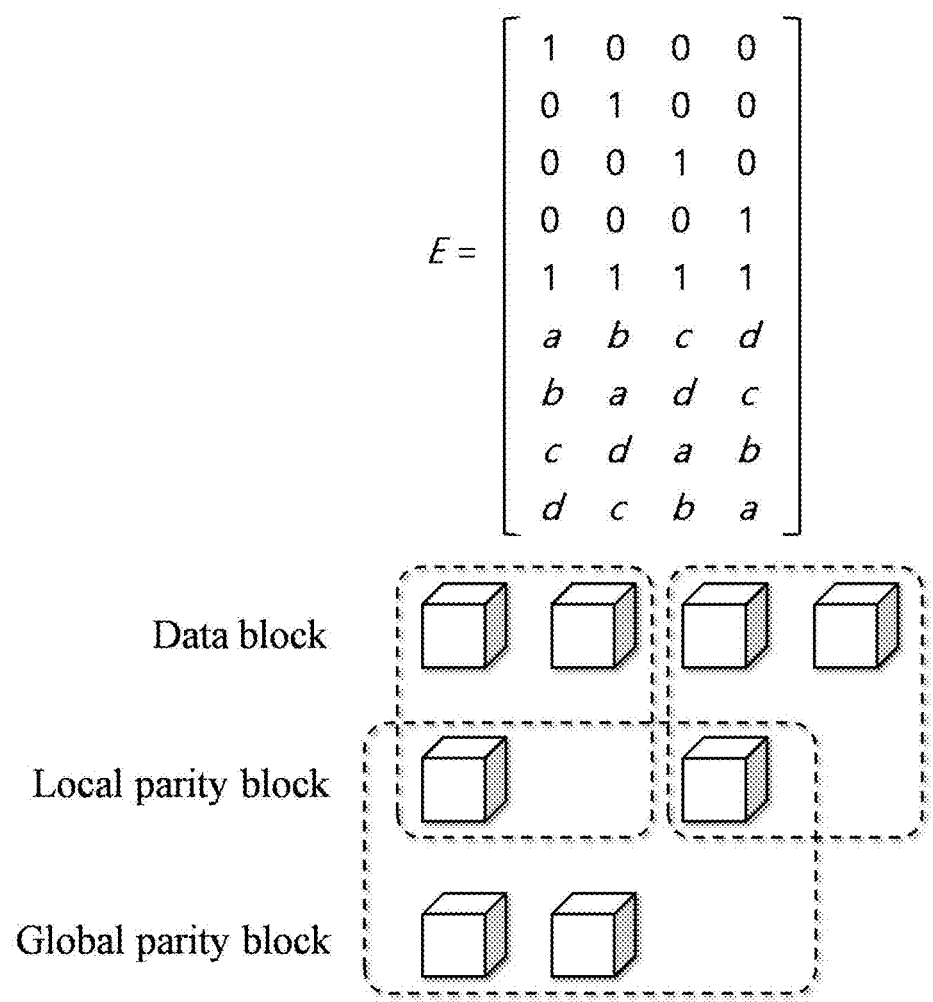
FIG. 7 illustrating an example of a group that allows erasure of a single block from blocks merged from two 5×2 encoding matrices according to at least one example embodiment.

In some example embodiments, a portion of data for which encoding is completed may be erased, because the portion of data may be recovered through decoding. Recovery may be performed based on two cases: a locally repairable case and a locally nonrepairable case. The locally repairable case refers to a case in which only a single block is erased in a data block and a corresponding local parity block of the data block, or, alternatively, a case in which only a single block is erased in a local parity block and a corresponding global parity block. FIG. 7 illustrates an example of a block group that allows erasure of a single block from blocks merged from two 5×2 encoding matrices according to at least one example embodiment. Referring to FIG. 7, the data set may be repaired even if a single block is erased from each block group indicated with dotted boxes, because the data from the erased blocks may be recovered using the other blocks included in each corresponding block group. In addition, data may be recovered using a global parity block in a similar manner as a recovery manner of an erasure code.

Figure 8:
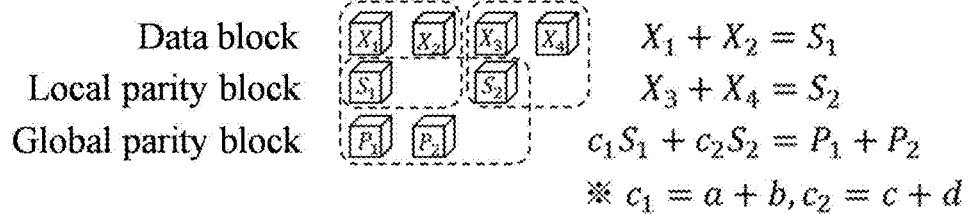
FIG. 8 illustrates an example of a locally repairable process according to at least one example embodiment.

FIG. 8 illustrates an example of a local repair process according to at least one example embodiment. When a data block or a local parity block in a group is erased, data may be recovered based on a simple XOR operation using the other data blocks of the group. For example, if local parity block $S_1$ is erased, $S_1$ may be locally repaired by adding data block $X_1$ and data block $X_2$; and if data block $X_1$ is erased, $X_1$ may be locally repaired by subtracting data block $X_2$ from $S_1$. If a local parity block, such as $S_1$, is unable to be recovered in this manner via a local repair process, or when a global parity block such as $P_1$ is erased, data may be recovered based on an XOR operation between a value acquired by multiplying each local parity block by a specific coefficient $c_i$ and a global parity block. The specific coefficient $c_i$ to be multiplied to the local parity block may be calculated using a value that is acquired by performing an XOR operation on all of the elements of a matrix for generating a global parity block of an encoding matrix before merging. Accordingly, the local repair may be performed although a single block is erased. Further, although a relatively large number of data blocks and local parity blocks compared to a number of global parity blocks are erased, data may be recovered based on a faster XOR operation.

Figure 9:
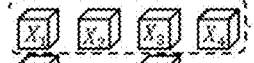
FIG. 9 illustrates an example of a data recovery process in a locally nonrepairable case according to at least one example embodiment.

FIG. 9 illustrates an example of a data recovery process in a locally nonrepairable case according to at least one example embodiment. In the locally nonrepairable case, data may be recovered in a similar manner as a decoding process of (n, k) erasure code using a global parity block. Here, when all of the local parity blocks are not erased, a block in which an XOR operation is performed on all of the local parity blocks may serve as an additional parity block, for example, a global parity block, of the (n, k) erasure code. Accordingly, in this case, a data recovery process may be performed using an erasure code having a number of parity block corresponding to a number of global parity blocks+1 parity block.

The aforementioned example embodiments may be suitable for performing multiple encoding on data to secure high availability in the locally repairable case. During an encoding process, a before-merge result may be repeatedly encoded using an XOR operation only. Therefore, it is possible to reduce calculation load when performing multiple encoding of data. The availability of data may be improved in that data is locally repairable regardless of a parity block and an additional global parity block may be generated using a local parity block. A data storage method according to example embodiments may be useful in the case of placing a group for each IDC and performing multiple encoding over a plurality of IDCs.

Figure 10:
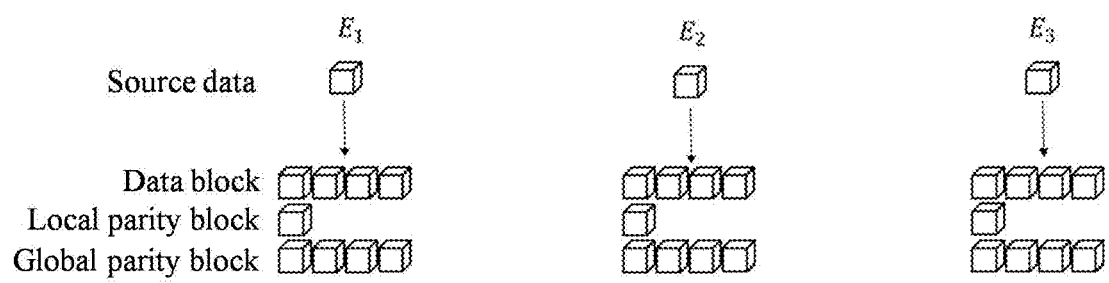
FIG. 10 illustrates an example of a before-merge encoding matrix and encoding result according to at least one example embodiment.

FIG. 10 illustrates an example of a before-merge encoding matrix and encoding result according to at least one example embodiment. FIG. 10 illustrates an example of encoding matrices $E_1$, $E_2$, and $E_3$ generated using a Cauchy matrix and encoding results of the respective encoding matrices $E_1$, $E_2$, and $E_3$. For example, 64 4×4 matrices may be generated by selecting 1, 2, 3, and 4 rows (4×256 matrix) of the Cauchy matrix and dividing each selected matrix by a square matrix in a 4×4 symmetric matrix form. Here, the generated 4×4 matrices may be used to generate a global parity block of an encoding matrix, which corresponds to $E_G$ of FIG. 1. Accordingly, 64 encoding matrices may be generated. The encoding matrices $E_1$, $E_2$, and $E_3$ of FIG. 10 may represent three matrices among the 64 encoding matrices.

Figure 12:
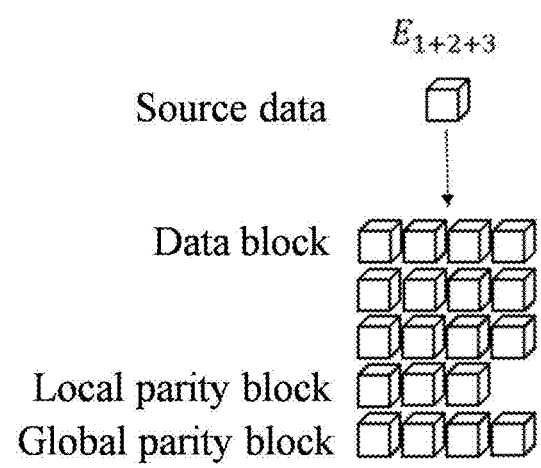

FIGS. 11 and 12 illustrate examples of an after-merge encoding matrix and a merge result according to at least one example embodiment. An after-merge encoding matrix of FIG. 11 does not have a characteristic of an erasure code encoding matrix and thus, is a matrix that simply represents an after-merge result and is not used for an erasure code decoding operation.

Figure 14:
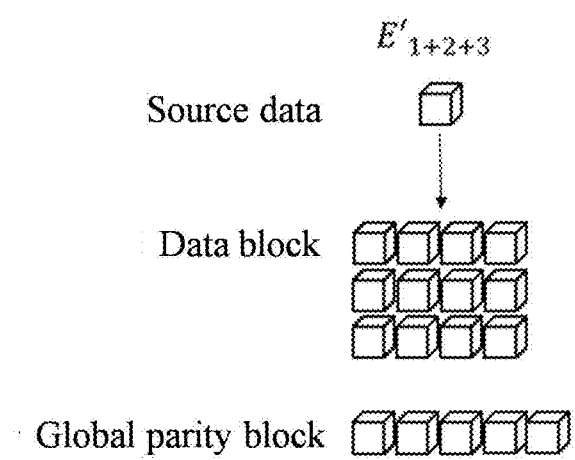

FIGS. 13 and 14 illustrate examples of an available encoding matrix and merge result in response to a need for a general (n, k) erasure code decoding operation after merge according to at least one example embodiment. An after-merge encoding matrix of FIG. 13 is a matrix that is used for an erasure code decoding operation. Here, an XOR operation is performed on three local parity blocks in the after-merge encoding matrix of FIG. 11. The after-merge encoding matrix of FIG. 13 shows a characteristic of an erasure code encoding matrix.

As described above, when all of the local parity blocks are available (that is, when none of the local parity blocks have been erased), a block in which an XOR operation is performed on all of the local parity blocks may serve as an additional parity block, for example, a global parity block, of (n, k) erasure code. That is, a block in which the XOR operation is performed on three local parity blocks of FIG. 12 is used as an additional global parity block of FIG. 14. Therefore, while four global parity blocks are present in FIG. 12, five global parity blocks are present in FIG. 14.

Figure 15:
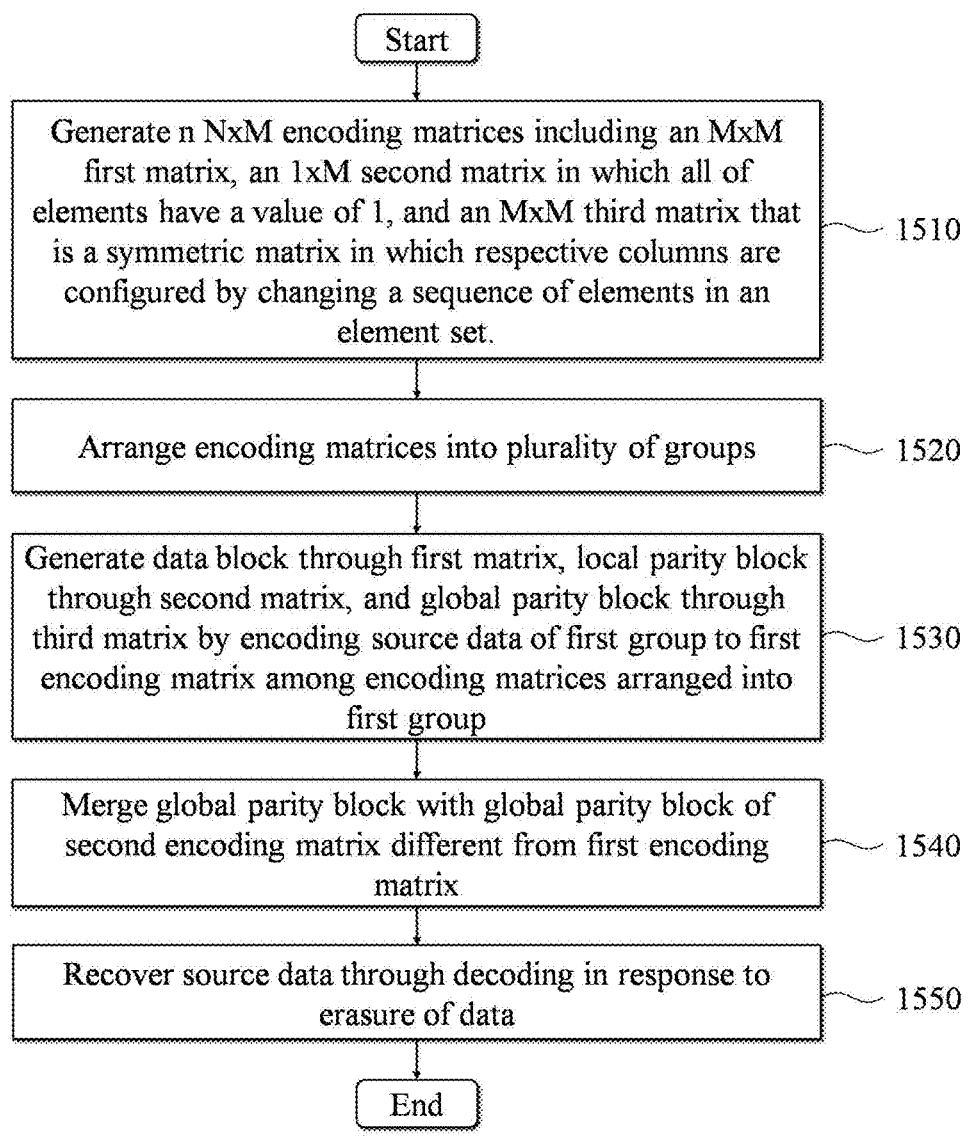
FIG. 15 is a flowchart illustrating an example of a data storage method according to at least one example embodiment.

FIG. 15 is a flowchart illustrating an example of a data storage method according to at least one example embodiment. The data storage method of FIG. 15 may be performed by, for example, the aforementioned computer apparatus 100. For example, the processing circuitry 120 of the computer apparatus 100 may be configured to execute an instruction according to a code of at least one program or a code of an OS included in the memory 110. Here, the processing circuitry 120 may control the computer apparatus 100 to perform operations 1510 to 1550 included in the data storage method of FIG. 15 in response to a control instruction provided from a code stored in the computer apparatus 100.

Referring to FIG. 15, in operation 1510, the computer apparatus 100 may generate n N×M encoding matrices including an M×M first matrix for generating a data block, an 1×M second matrix in which all of elements have a value of 1 for generating a local parity block, and an M×M third matrix that is a symmetric matrix in which respective columns are configured by changing a sequence of elements in an element set. Here, each of M, N, and n is a positive integer. Also, the encoding matrix may correspond to the encoding matrix E of FIG. 1, and the first matrix, the second matrix, and the third matrix may correspond to the matrix $E_L$, the matrix $E_L$, and the matrix $E_G$ of FIG. 1, respectively.

In operation 1520, the computer apparatus 100 may arrange the encoding matrices into a plurality of groups. For example, FIG. 4 illustrates an example in which nine encoding matrices are arranged into three groups.

In operation 1530, the computer apparatus 100 may generate a data block through the first matrix, a local parity block through the second matrix, and a global parity block through the third matrix by encoding source data of a first group with a first encoding matrix among encoding matrices arranged into the first group.

In operation 1540, the computer apparatus 100 may merge the global parity block with a global parity block of a second encoding matrix different from the first encoding matrix. FIG. 5 illustrates an example of merging global parity blocks. Here, as described above, deletion of a global parity block used for merge may be delayed for reusing the global parity block. For example, the computer apparatus 100 may delete the global parity block used for merge when merging is performed a certain (e.g., desired, specified, or preset) number of times, instead of deleting the global parity block used for merge.

Also, in operation 1540, the second encoding matrix may be one of encoding matrices arranged into the first group. In this case, operation 1540 may represent merging global parity blocks in the same group. As another example, the second encoding matrix may be one of encoding matrices arranged into a second group different from the first group. In this case, operation 1540 may represent merging global parity blocks of different groups. Data of which encoding is completed may be merged with data that is generated using another encoding matrix of the same group or of another group.

Here, merging between global parity blocks may represent processing an XOR operation between matrices corresponding to the respective global parity blocks. For example, in operation 1540, the computer apparatus 100 may process the XOR operation between a matrix corresponding to the global parity block and a matrix corresponding to the global parity block of the second encoding matrix.

In operation 1550, the computer apparatus 100 may recover source data through decoding in response to erasure of data.

For example, when only a single block is erased in a first block group that includes a data block and a local parity block of the data block or a second block group that includes a local parity block and a global parity block in the first group, the computer apparatus 100 may recover source data that includes an erased block using blocks remaining in the first block group or blocks remaining in the second block group. Here, when a single data block or a single local parity block is erased in the first block group, the computer apparatus 100 may recover the source data based on an XOR operation between the blocks remaining in the first block group. When a single block is erased in the second block group and the erased block is unrecoverable using an XOR operation in the first block group, the computer apparatus 100 may recover the source data based on an XOR operation between a value acquired by multiplying each of local parity blocks remaining in the second block group by a specific coefficient $c_i$ and global parity blocks remaining in the second block group. Here, the specific coefficient $c_i$ may be calculated based on an XOR operation between elements of the third matrix.

When a block is erased to be locally nonrepairable, computer apparatus 100 may recover resource data using decoding of (n, k) erasure code. Here, k is a positive integer. When all of the local parity blocks in the first group are available (that is, when none of the local parity blocks has been erased), the computer apparatus 100 may process decoding of the (n, k) erasure code using a result block of an XOR operation between local parity blocks as an additional global parity block.

Figure 16:
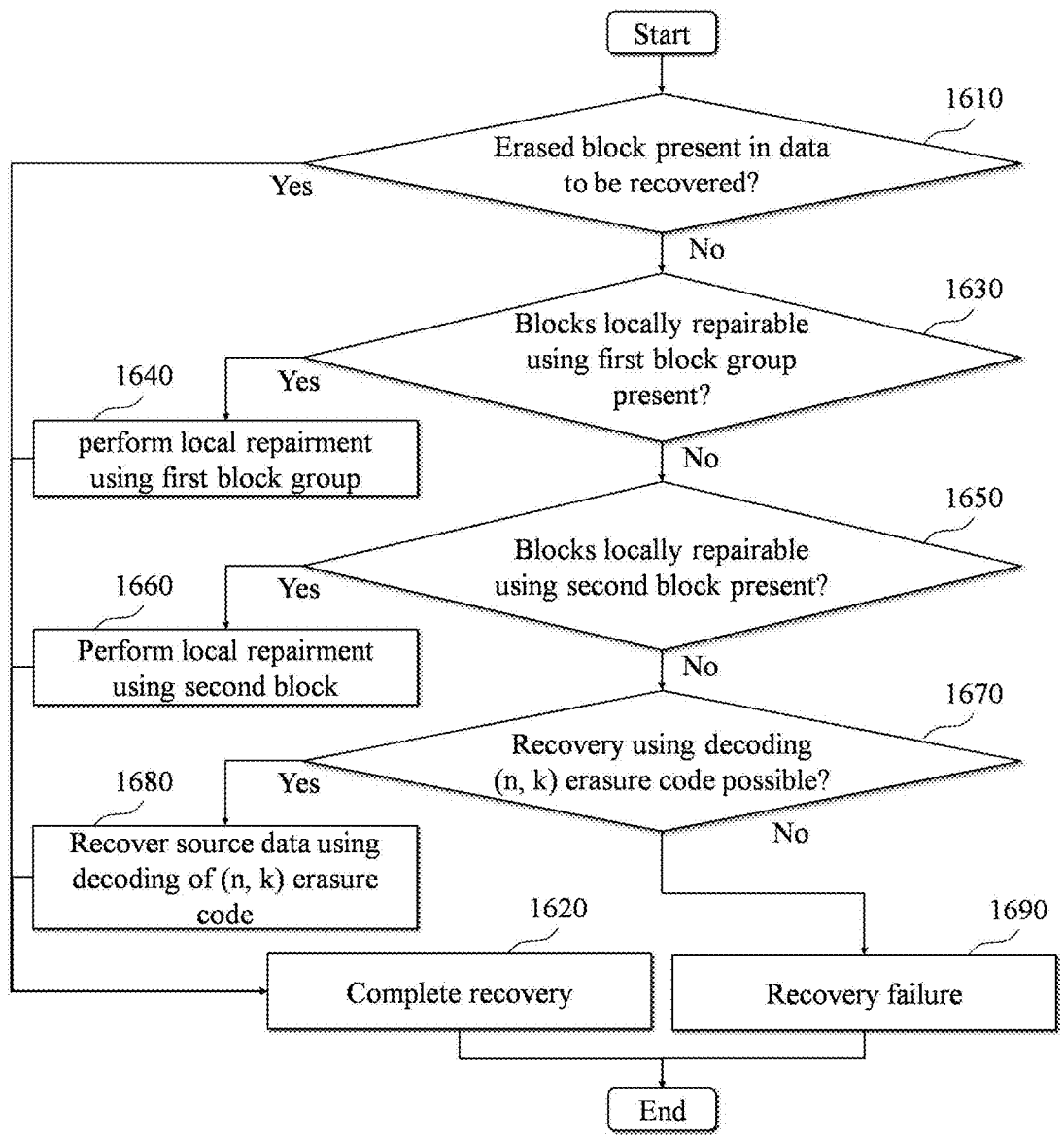
FIG. 16 is a flowchart illustrating an example of a failure recovery process according to at least one example embodiment.

FIG. 16 is a flowchart illustrating an example of a failure recovery process according to at least one example embodiment. Processes of FIG. 16 may be included in operation 1550 of FIG. 15 performed by the computer apparatus 100.

Referring to FIG. 16, in a first process 1610, the computer apparatus 100 may determine whether an erased block is present in data to be recovered. Here, when the erased block is absent, the computer apparatus 100 may complete recovery in a second process 1620. When the erased block is present, the computer apparatus 100 may recover data of the erased block through local repair or decoding of (n, k) erasure code in the following third process 1630 to eighth process 1680. A ninth process 1690 represents a recovery failure of source data.

In the third process 1630, the computer apparatus 100 may determine whether blocks locally repairable using a first block group are present. Here, when the blocks locally repairable using the first block group are present, the computer apparatus 100 may recover data of the erased block using the first block group in the fourth process 1640. For example, as described above, when a single data block or a single local parity block is erased in the first block group, the computer apparatus 100 may recover source data based on an XOR operation between blocks remaining in the first block group. In this case, the computer apparatus 100 may complete recovery through the second process 1620. When blocks locally repairable using the first block group are absent, the fifth process 1650 may proceed.

In the fifth process 1650, the computer apparatus 100 may determine whether blocks locally repairable using the second block group are present. Here, when the blocks locally repairable using the second block group are present, the computer apparatus 100 may recover data of the erased block using the second block group in the sixth process 1660. For example, as described above, when a single block is erased in the second block group and the erased block is unrecoverable using an XOR operation in the first block group, the computer apparatus 100 may recover the source data based on an XOR operation between a value acquired by multiplying each of local parity blocks remaining in the second block group by a specific coefficient $c_i$ and global parity blocks remaining in the second block group. In this case, the computer apparatus 100 may complete recovery through the second process 1620. When the blocks locally repairable using the second block group are absent, the seventh process 1670 may proceed.

In the seventh process 1670, the computer apparatus 100 may determine whether recovery using decoding of the (n, k) erasure code is possible. Here, when recovery using decoding of the (n, k) erasure code is possible, the computer apparatus 100 may recover source data using decoding of the (n, k) erasure code in the eighth process 1680. In this case, the computer apparatus 100 may complete recovery through the second process 1620. When recovery of data may not be performed using decoding of the (n, k) erasure code in the seventh process 1670, recovery of the source data fails as in the ninth process 1690.

As described above, according to some example embodiments, a locally repairable code for generating a local parity block may be generated without an additional increase in the complexity using an encoding matrix of an erasure code to prevent the complexity for generating the locally repairable code from significantly increasing to be proportional to (n, k) parameters. Also, when a local repair is required due to erasure of data and a local parity block, a process of a finite field operation may be eliminated by recovering an erased block using an exclusive OR (XOR) operation alone, which differs from the related art in which data is recovered by applying the XOR operation to a result of the finite field operation. Also, in the case of redundantly encoding the same data, an intermediate result value of an existing operation may be reused instead of performing an operation on source data, which may lead to efficient multiple encoding using an XOR operation alone and accordingly, reducing a number of finite field operations. Also, if a plurality of pieces of data are generated from different encoding matrices, efficient multiple encoding may be performed by merging any intermediate result value regardless of sequence thereof. Thus, a computer apparatus of an Internet data center (IDC) may recover from erasing locally stored data, a local parity block, and/or a global parity block, and/or may enable another computer apparatus of an Internet data center (IDC) to recover from erasing remotely stored data block, a remotely stored local parity block, and/or a global parity block. Such recovery may occur without storing complete replicas of stored data (that is, providing data storage efficiency), with a reduced exchange of data over a network such as between IDCs (that is, providing network efficiency); with reduced computation as compared with other encoding techniques and erasure codes (that is, providing computational efficiency); and/or faster than other encoding techniques and erasure codes (that is, providing time efficiency).

The systems and/or apparatuses described herein may be implemented using hardware components, software components, and/or a combination thereof. For example, processing circuitry may be implemented using one or more general-purpose or special purpose computers, such as, for example, a processor, a controller and an arithmetic logic unit, a digital signal processor, a microcomputer, a field-programmable gate array (FPGA), a programmable logic unit, a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, the processing circuitry of a processing device may include multiple processors or a processor and a controller. In addition, different processing configurations are possible, such as parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. For example, the software and data may be stored by one or more computer readable storage mediums.

The methods according to the example embodiments may be recorded in non-transitory computer-readable record media including program instructions to implement various operations embodied by a computer. The media may also include, alone or in combination with the program instructions, data files, data structures, and the like. The media and program instructions may be those specially designed and constructed for the purposes, or they may be of the kind well-known and available to those having skill in the computer software arts. Examples of non-transitory computer-readable record media include magnetic media such as hard disks, floppy disks, and magnetic tape; optical media such as CD ROM disks and DVD; magneto-optical media such as floptical disks; and hardware devices that are specially to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be to act as one or more software modules in order to perform the operations of the above-described example embodiments, or vice versa.

The foregoing description has been provided for purposes of illustration and description. It is not intended to be exhaustive or to limit the disclosure. Individual elements or features of an example embodiment are generally not limited to that example embodiment, but, where applicable, are interchangeable and can be used in a selected example embodiment, even if not specifically shown or described. The same may also be varied in many ways. Such variations are not to be regarded as a departure from the disclosure, and all such modifications are intended to be included within the scope of the disclosure.

What is claimed is:

1. A data storage method performed by a computer apparatus comprising processing circuitry, the method comprising:
    receiving, by the processing circuitry, source data to be encoded;
    generating, by the processing circuitry, n N×M encoding matrices, each encoding matrix comprising an M×M first matrix based on the source data, an 1×M second matrix in which all of elements have a value of 1, and an M×M third matrix that is a symmetric matrix in which respective columns are configured by changing a sequence of elements from an element set, where each of M, N, and n is a positive integer;
    arranging, by the processing circuitry, the encoding matrices into a plurality of groups;
    generating, by the processing circuitry and using a first encoding matrix among encoding matrices arranged into a first group, a data block through the first matrix of the first encoding matrix, a local parity block through the second matrix of the first encoding matrix, and a global parity block through the third matrix of the first encoding matrix by encoding source data of the first group with the first encoding matrix;
    merging, by the processing circuitry, the global parity block with a global parity block of a second encoding matrix that is different than the first encoding matrix; and
    storing, by the processing circuitry, the merged global parity block in a memory, for recovering the source data.

2. The method of claim 1, wherein the second encoding matrix is one of the encoding matrices arranged into the first group.

3. The method of claim 1, wherein the second encoding matrix is one of encoding matrices arranged into a second group that is different than the first group.

4. The method of claim 1, wherein the merging comprises processing an exclusive OR (XOR) operation between a matrix corresponding to the global parity block and a matrix corresponding to the global parity block of the second encoding matrix.

5. The method of claim 1, further comprising:
    deleting the global parity block used for merge when the merging is completed a number of times.

6. The method of claim 1, further comprising:
    recovering source data that includes an erased block using blocks remaining in a first block group or blocks remaining in a second block group when a single block is erased in the first block group that includes a data block and a local parity block of the data block or the second block group that includes a local parity block and a global parity block in the first group.

7. The method of claim 6, wherein the recovering of the source data comprises recovering the source data based on an XOR operation between the blocks remaining in the first block group when a single data block or a single local parity block is erased in the first block group, and recovering the source data based on an XOR operation between a value acquired by multiplying each of local parity blocks remaining in the second block group by a specific coefficient c and global parity blocks remaining in the second block group when a single local parity block is erased in the second block group, and the specific coefficient c is calculated based on an XOR operation between elements of the third matrix.

8. The method of claim 6, wherein the recovering of the source data comprises recovering the source data based on an XOR operation between a value acquired by multiplying each of local parity blocks remaining in the second block group by a specific coefficient c and global parity blocks remaining in the second block group when a single global parity block is erased in the second block group, and the specific coefficient c is calculated based on an XOR operation between elements of the third matrix.

9. The method of claim 1, further comprising:
recovering the source data using decoding of an (n, k) erasure code when a block is erased to be locally nonrepairable in at least one of the first group and a second group, where k is a positive integer.

10. The method of claim 9, wherein the recovering of the source data comprises processing decoding of the (n, k) erasure code using a result block of an XOR operation between local parity blocks as an additional global parity block when all of the local parity blocks remain in the first group.

11. A non-transitory computer-readable storage medium storing a computer program that, when executed by processing circuitry, causes the processing circuitry to perform the method of claim 1.

12. A computer apparatus comprising:
processing circuitry configured to execute computer-readable instructions in the computer apparatus,
wherein the processing circuitry is configured to receive source data to be encoded,
generate n N×M encoding matrices, each encoding matrix comprising an M×M first matrix based on the source data, an 1×M second matrix in which all of elements have a value of 1, and an M×M third matrix, the third matrix being a symmetric matrix in which respective columns are configured by changing a sequence of elements from an element set, where each of M, N, and n is a positive integer,
arrange the encoding matrices into a plurality of groups,
generate, using a first encoding matrix among encoding matrices arranged into a first group, a data block through the first matrix of the first encoding matrix, a local parity block through the second matrix of the first encoding matrix, and a global parity block through the third matrix of the first encoding matrix by encoding source data of the first group with the first encoding matrix, and
merge the global parity block with a global parity block of a second encoding matrix that is different than the first encoding matrix; and
store the merged global parity block in a memory, for recovering the source data.

13. The computer apparatus of claim 12, wherein the second encoding matrix is one of the encoding matrices arranged into the first group.

14. The computer apparatus of claim 12, wherein the second encoding matrix is one of encoding matrices arranged into a second group that is different than the first group.

15. The computer apparatus of claim 12, wherein the processing circuitry is configured to process an exclusive OR (XOR) operation between a matrix corresponding to the global parity block and a matrix corresponding to the global parity block of the second encoding matrix.

16. The computer apparatus of claim 12, wherein the processing circuitry is configured to delete the global parity block used for merge when the merging is completed a number of times.

17. The computer apparatus of claim 12, wherein the processing circuitry is configured to recover source data that includes an erased block using blocks remaining in a first block group or blocks remaining in a second block group when a single block is erased in the first block group that includes a data block and a local parity block of the data block or the second block group that including a local parity block and a global parity block in the first group.

18. The computer apparatus of claim 12, wherein the processing circuitry is configured to recover the source data using decoding of (n, k) erasure code when a block is erased to be locally nonrepairable in at least one of the first group and a second group, where k is a positive integer.

* * * * *